United States Patent
Chopra et al.

(10) Patent No.: US 6,654,942 B2
(45) Date of Patent: Nov. 25, 2003

(54) METHOD AND SYSTEM FOR PROVIDING A NETLIST DRIVEN INTEGRATED ROUTER IN A NON-NETLIST DRIVEN ENVIRONMENT

(75) Inventors: Sachin Chopra, Santa Clara, CA (US); Peter Fu, Sunnyvale, CA (US); Kong-Fal Woo, San Jose, CA (US); Peter Lai, San Jose, CA (US); Srirarm Satakopan, Sunnyvale, CA (US); Hsiu-Nien Chen, San Jose, CA (US); Von-Kyoung Kim, Santa Clara, CA (US); Yongjun Zhang, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 47 days.

(21) Appl. No.: 09/938,120

(22) Filed: Aug. 22, 2001

(65) Prior Publication Data

US 2003/0041310 A1 Feb. 27, 2003

(51) Int. Cl.$^7$ .............................................. G06F 17/50
(52) U.S. Cl. ............................... 716/12; 716/14; 716/13
(58) Field of Search ................................. 716/4, 5, 6, 8, 716/12, 13, 14, 15, 16, 17, 18

(56) References Cited

U.S. PATENT DOCUMENTS

| | | | | | |
|---|---|---|---|---|---|
| 5,483,461 | A | * | 1/1996 | Lee et al. | 716/14 |
| 5,586,319 | A | * | 12/1996 | Bell | 716/17 |
| 5,901,064 | A | * | 5/1999 | Weber et al. | 716/12 |
| 5,995,730 | A | * | 11/1999 | Blinne | 716/4 |
| 6,077,308 | A | * | 6/2000 | Carter et al. | 716/8 |
| 6,230,301 | B1 | * | 5/2001 | Weber | 716/4 |

* cited by examiner

*Primary Examiner*—Vuthe Siek
*Assistant Examiner*—Binh Tat
(74) *Attorney, Agent, or Firm*—Martine & Penilla, LLP

(57) ABSTRACT

Method and system for providing a netlist driven integrated router in a non-netlist driven environment for microprocessor designs includes retrieving top level netlist for the existing microprocessor design from the top level database and the design parameters for the new microprocessor design, and translating these netlist and design parameters at the front end so that the resulting data can be provided to an integrated router which is configured to generate re-routes for the new microprocessor design based on the top level netlist and the design parameters, where the generated re-routes are provided to a back end for translating the re-routes to new top level netlist and merging the new top level netlist with the existing top level netlist database.

32 Claims, 2 Drawing Sheets

US 6,654,942 B2

METHOD AND SYSTEM FOR PROVIDING A NETLIST DRIVEN INTEGRATED ROUTER IN A NON-NETLIST DRIVEN ENVIRONMENT

BACKGROUND OF THE INVENTION

1. Field of the Invention

The present invention relates to the design of microprocessors. In particular, the present invention relates to method and system for providing compact, netlist driven top level routing approach for microprocessor family designs.

2. Description of the Related Art

To maintain a competitive edge in the market for microprocessors, it is imperative to reduce the time needed to realize the microprocessor design into a viable commercial product while at the same time increasing the speed and reliability of the microprocessor. To this end, in designing each successive generation of microprocessors within a given family of microprocessor design (for example, Sun SPARC microprocessors from Sun Microsystems, Inc., or x486 family for microprocessors from Intel Corporation), it is important to extract as much of the existing design as possible from the existing family of microprocessors in the design and implementation of the successive microprocessor.

Existing processor design techniques help only to a certain extent in extending the life of a particular family of microprocessors. Indeed, in most cases, many of the design issues have been considered and incorporated in the early stages of the particular microprocessor family development. To increase the speed as well as reliability, while holding onto a majority of the old design, new and robust CAD techniques and initiatives are necessary. This is particularly acute in the case of designing microprocessors with greater than 20 million transistor count.

Presently available design approaches to maintain or extract many of the existing features of a microprocessor family while improving the speed and reliability of each successive microprocessor in a given family include, for example, adding a second level on a chip cache, moving to a smaller transistor width process technology, and taking advantage of advanced tools to route the chip more effectively.

While the approaches discussed above may be applied to a particular design of microprocessors, it remains important to maintain the design of prior generation of microprocessors in the design of each successive microprocessor. That is, the CAD tools that were used in the design process should preferably be continued with the design of each successive generation of microprocessors. Indeed, it would be desirable to have new CAD techniques that would permit taking advantage of the new design tools while preserving the use of the old design tools.

SUMMARY OF THE INVENTION

In view of the foregoing, a method of providing a netlist driven routing in accordance with one embodiment of the present invention may include the steps of retrieving one or more design parameters and one or more top level design criteria, translating said retrieved one or more design parameters and said top level design criteria, generating one or more top level re-routes based on said translated one or more design parameters and top level design criteria, and converting said generated one or more top level re-routes into a compatible syntax.

The one or more design parameters may include a die size, a metal orientation information of the routing layer, and a timing information. Furthermore, the one or more top level design criteria may include connectivity information corresponding to a plurality of block components of an existing design layout. Additionally, the one or more top level design criteria may include a plurality of abstracts of block components, while the one or more of design parameters may include one or more netlists.

In a further aspect of the present invention, each of said one or more netlists may include a connectivity information corresponding to a respective one or more of block components.

Moreover, said connectivity information of said respective one or more of said block components may include a pin name information of each of said block components and a connection information corresponding to each of said pin name information.

Additionally, the generating step may include the step of optimizing each of said one or more top level re-routes.

Further, the method in one aspect of the present invention may include the step of verifying said compatible syntax, where the verifying step may include the step of comparing said converted one or more top level re-routes with a corresponding one or more netlists.

Moreover, the corresponding one or more netlists may include connection information related to an existing design layout of a microprocessor.

A method of providing a netlist driven routing in accordance with another embodiment of the present invention includes the steps of retrieving one or more design parameters and one or more top level design criteria, translating said retrieved one or more design parameters and said top level design criteria, generating one or more top level re-routes based on said translated one or more design parameters and top level design criteria, converting said generated one or more top level re-routes into a compatible syntax, and verifying said compatible syntax.

An apparatus for providing a netlist driven routing in accordance with yet another embodiment of the present invention includes means for retrieving one or more design parameters and one or more top level design criteria, means for translating said retrieved one or more design parameters and said top level design criteria, means for generating one or more top level re-routes based on said translated one or more design parameters and top level design criteria, and means for converting said generated one or more top level re-routes into a compatible syntax.

The one or more design parameters may include a die size, a metal orientation information of the routing layer, and a timing information.

The one or more top level design criteria may include connectivity information corresponding to a plurality of block components of an existing design layout.

Furthermore, the one or more top level design criteria may include a plurality of abstracts of block components, while the one or more of design parameters may include one or more netlists.

Additionally, each of said one or more netlists may include a connectivity information corresponding to a respective one or more of block components, where the connectivity information of said respective one or more of said block components may include a pin name information of each of said block components and a connection information corresponding to each of said pin name information.

Furthermore, the generating means may include means for optimizing each of said one or more top level re-routes, while the apparatus may additionally include means for verifying said compatible syntax.

Moreover, the verifying means may include means for comparing said converted one or more top level re-routes with a corresponding one or more netlists, where the corresponding one or more netlists may include connection information related to an existing design layout of a microprocessor.

These and other features and advantages of the present invention will be understood upon consideration of the following detailed description of the invention and the accompanying drawings.

DESCRIPTION OF THE PREFERRED EMBODIMENT

Figure 1:
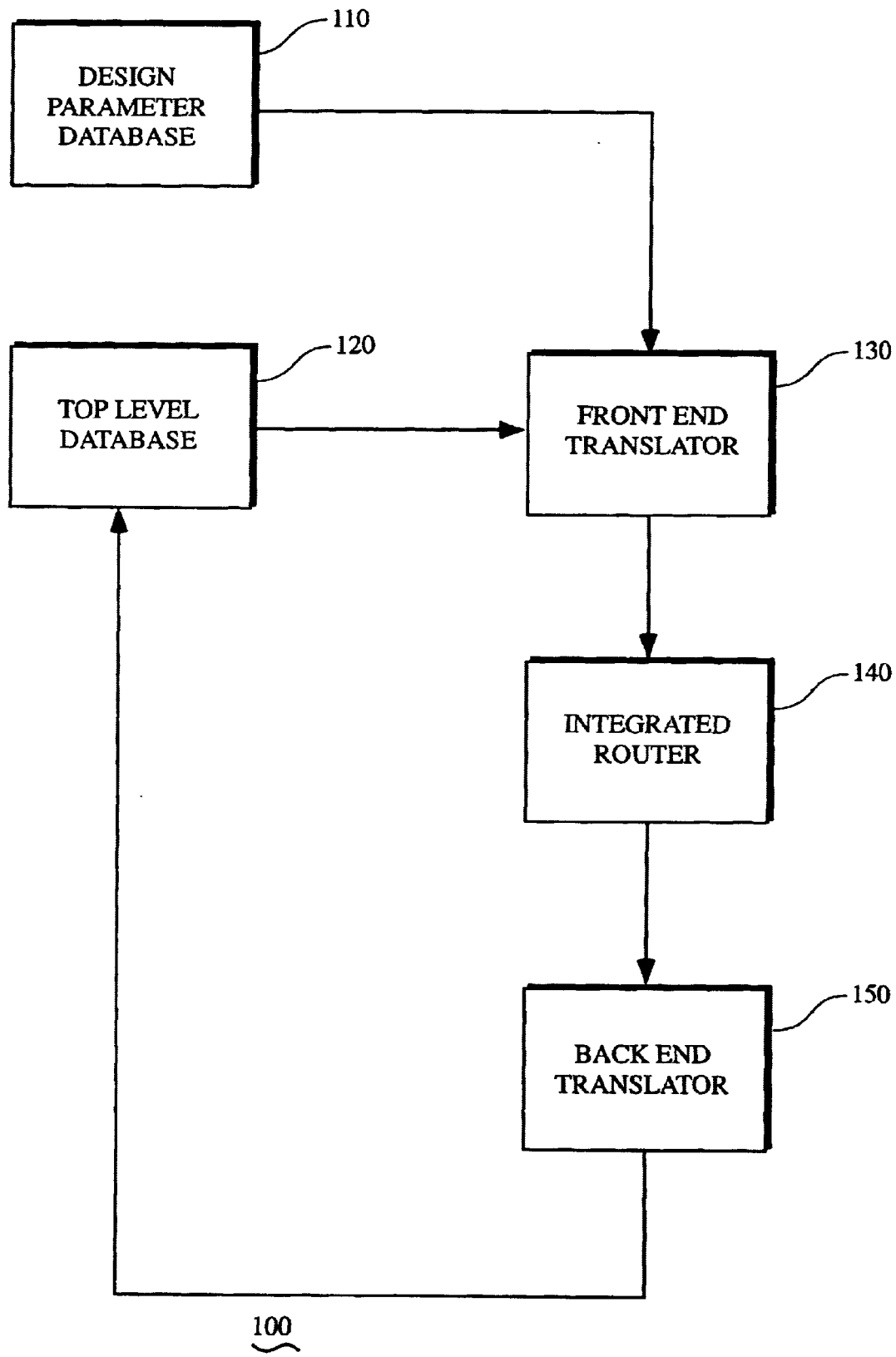
FIG. 1 illustrates a block diagram of a system of providing an integrated netlist driven router in a non-netlist driven environment in accordance with one embodiment of the present invention.

FIG. 1 illustrates a block diagram of a system of providing an integrated netlist driven router in a non-netlist driven environment in accordance with one embodiment of the present invention. Referring to FIG. 1, the integrated netlist driven routing environment 100 of one aspect of the present invention includes a design parameter database 110, a top level design database 120, a front end translation unit 130, an integrated routing unit 140, and a back end translation unit 150. The design parameter database 110 in one embodiment is configured to store design criteria for the new design of, for example, a next generation microprocessor in a given microprocessor family.

For example, in one aspect of the present invention, the design parameter database 110 may be configured to store design criteria such as the new design die size, timing constraints of the various connections of the blocks for the new design, and connectivity information of each block in the new design such as netlists. The design parameter database 110 may further be configured to store metal orientation information of the routing layer for the new design for the various metal layers from metal 1 through metal 7, each of which may be configured to design the routing for the various aspects and features of the new design. Examples of metal orientation information may include, in one embodiment, the routing information of the positive power supply (for example, as defined by the orientation of metal 6 which is set to be vertical only), the routing information of the ground terminal and so on.

Referring back to FIG. 1, the timing information of the connections stored in the design parameter database 110 may include, for example, the timing constraints for the particular newly proposed design for each pin connection for each component block in the new design so as to meet or exceed the operational criteria of the newly proposed design of the microprocessor. Furthermore, as discussed above, information related to the die size of the newly proposed design may be stored in the design parameter database 110. Alternatively, in the case where the newly proposed design of the microprocessor does not include a modification of the die size, the information related to the die size may be omitted.

Referring again to FIG. 1, the design parameter database 10 is also configured to store netlists for the newly proposed design of the microprocessor, for example, providing information corresponding to the connectivity of the various block components of the new design. In one aspect of the present invention, the design parameter database 110 may be configured to store other information corresponding to the newly proposed microprocessor design criteria including component parameters and constraints, among others.

The top level database 120 of the integrated netlist driven routing environment 100 shown in FIG. 1 includes, among others, block level design criteria information for the existing design including abstracts of the block components of the existing design. In particular, the abstracts of the block components of the existing design include a top level information corresponding to the pin name designation for each block component, the location information for each pin of each block component (for example, by way of a defined coordinate set), as well as connection information for each pin of each block component in the existing design.

Referring back to FIG. 1, the front end translation unit 130 in one embodiment of the present invention is provided with data stored in the design parameter database 110 and the top level database 120, which is then configured to generate connectivity information (or netlists) for the block components in the newly proposed design of the next generation microprocessor. More specifically, the front end translation unit 130 may be configured to convert the information received from the design parameter database 110 and the top level database 120 including, for example, the die size information, the timing information, the metal orientation information, and block components connectivity information, into a format (or syntax) compatible with the integrated routing unit 140. With the received information, the integrated routing unit 140 may be configured to generate new routing information for the layout of the block components in the newly proposed design independent of the underlying environment. An example of the integrated routing unit 140 includes IC Craftman available from Cadence Corporation.

The routing information for each block component of the newly proposed design layout generated by the integrated routing unit 140 is then provided to the back end translation unit 150 which is configured to convert the newly determined routing information into a syntax compatible with the underlying environment, that is, into the same syntax format of data stored in the top level database 120. The converted routing information is provided to the top level database 120 and compared to the parameters of the existing design layout to verify, among others, noise, timing, connectivity and so on.

In the manner described above, in accordance with various aspects of the present invention, the integrated routing approach may be configured to use more compact netlist driven top level routing while using the old library blocks that were routed using the old design tools. Indeed, the integrated routing approach one embodiment of the present invention may be configured to perform transition from one library format to the other at any stage in the design process. In this manner, the design tools used for the design of the next generation of microprocessor may be based on the library of the old design tools used in the design of the prior generation microprocessor. More specifically, the library of the old design tools used in the design of the next generation microprocessor includes design aspects such as RC extraction, noise analysis, power and timing estimation and so on.

In the manner described above, in accordance with one aspect of the present invention, the noise, timing and power may be estimated at any state rather than only at the end of the microprocessor design process such that correction and verification procedures may be implemented during the design process to detect and correct for design errors to reduce the overall design cycle time. Furthermore, in accordance with one embodiment of the present invention, the netlist driven integrated router for the design of the successive microprocessor in a family of microprocessors may be configured to have a small turnaround time which would allow flexibility to adjust and modify the various different design parameters such as routing for the layers, power grid width, number of vias, and so on.

Figure 2:
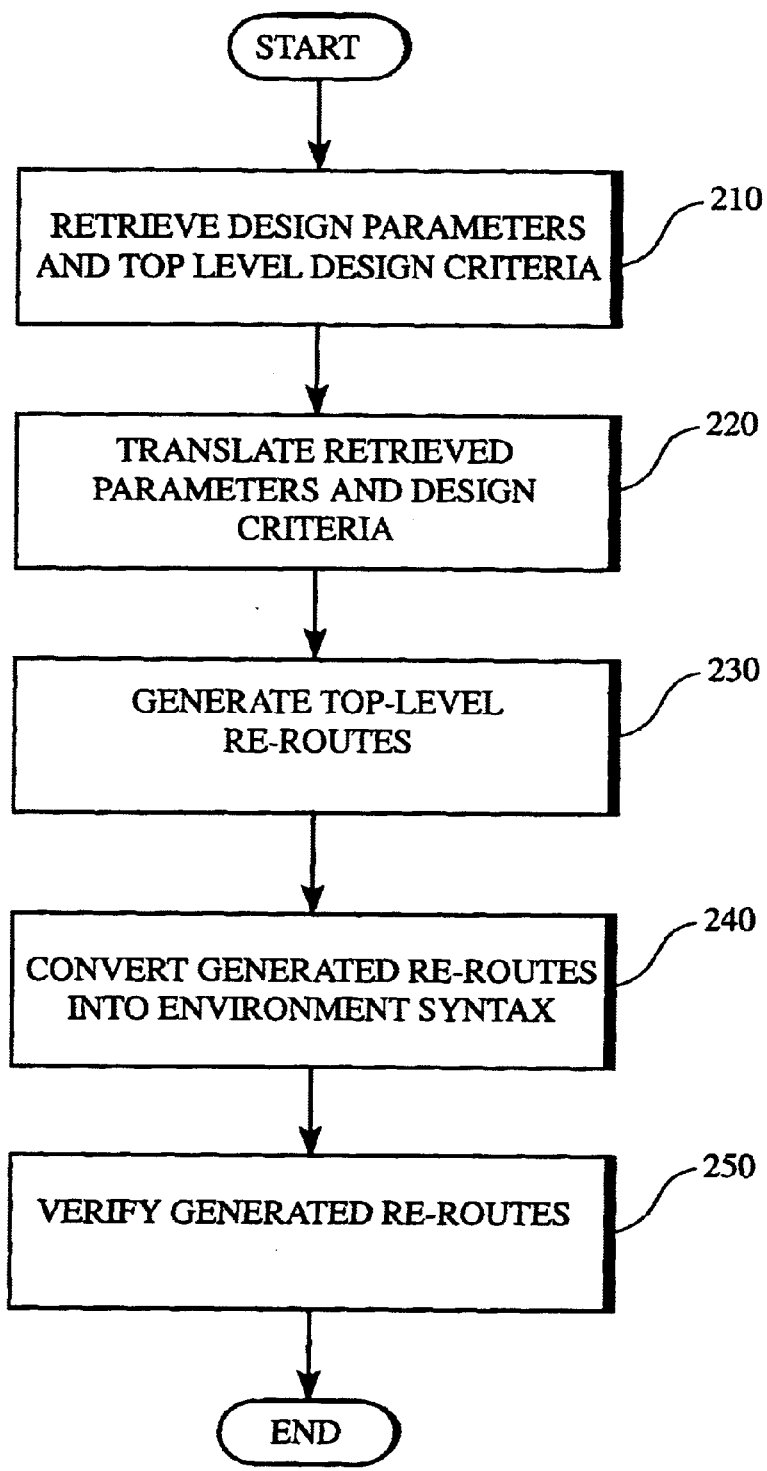
FIG. 2 illustrates a flow chart illustrating a procedure for providing an integrated netlist driven router in a non-netlist driven environment in accordance with one embodiment of the present invention.

FIG. 2 illustrates a flow chart illustrating a procedure for providing an integrated netlist driven router in a non-netlist driven environment in accordance with one embodiment of the present invention. Referring to FIG. 2, at step 210, the design parameters for the layout of the next generation microprocessor design as well as the top level design criteria of the existing design layout are retrieved from, for example, the design parameter database 110 and the top level database 120 (FIG. 1). As discussed above, the design parameters may include, among others, the die size of the new layout (if different from the existing design), the timing information, the metal orientation of the routing layer and connection information, while the retrieved top level design criteria may include information at the block component level of the existing design such as abstracts of the block components specifying the pin connection and location information for each block component in the existing design.

Referring back to FIG. 2, at step 220, the retrieved design parameters and top level design criteria are translated into a syntax format for use in netlist routing environment, and at step 230, top level re-routes for the new design layout are generated based on the translated design parameters and top level design criteria. At step 240, the generated top level re-routes are converted into the syntax of the existing environment for compatibility. Thereafter at step 250, the generated re-routes are verified for parameters such as noise, timing and connectivity based on the existing layout flow retrieved from the existing design layout.

As discussed above, in accordance with the various embodiments of the present invention, the netlist driven integrated routing approach may be divided into two parts— the front end translation and the back end translation—both of which may be independent of the underlying environment except for the syntax. In other words, in accordance with one embodiment of the present invention, the integrated routing may be configured to apply to any environment that has been previously used. More specifically, the front end translation unit 130 may be configured to interface with the microprocessor design at the high level while the back end translation unit 150 (FIG. 1) may be configured to interface with the underlying environment. In this manner, the front end translation unit 130 (FIG. 1) may be configured to use the top level netlists, the top level design outline, and the design outline for each of the sub-blocks to be used in the layout of each of the top level block component It is to be noted that each of the inputs to the front end translation unit may already be present in the format of the native underlying environment which was used to create the sub-blocks. In particular, the integrated routing approach of one embodiment of the present invention may be used to generate the top level block without interfering with the existing sub-blocks. Moreover, in one aspect of the present invention, the design outline of the sub-blocks may be sufficient for processing by the front end translation unit 130 (FIG. 1) rather than requiring the complete layout of the design.

Indeed, with these inputs, the front end translation unit 130 (FIG. 1) may, in one embodiment of the present invention, be configured to generate a design file that is provided to the integrated routing unit 140 (FIG. 1). The netlist driven integrated routing unit 140 may then be used to route the design block independent of the underlying environment. The limitations of the underlying environment which has traditionally been used may not be forwarded to the routing methodology used in the laying out of the new block components. In this manner, in one aspect of the present invention, a dense and robust routing as compared to the existing design approach may be obtained which could otherwise not have been available within the old design environment.

Referring back, as discussed above, in one aspect of the present invention, the back end translation unit 150 as discussed above in conjunction with FIG. 1 may then be used to convert the output of the netlist driven integrated routing unit 140 into the syntax of the underlying environment. In one embodiment, this conversion may take place at any stage of the routing which would permit early detection of any errors. Furthermore, the conversion discussed above may be relatively fast which would reduce the turnaround time. For example, while routing with the netlist driven routing approach of the present invention, keepouts may be placed in the block component without certainty that the keepouts are accurately placed with respect to the other block components. In such a case, it is not necessary to wait for the completion of the routing procedure to convert the data into the format of the underlying environment. Rather, the conversion may be performed immediately and the placement of the keepouts with respect to those in other block components (the other blocks are the ones that have been previously created) may be verified contemporaneously. In this manner, in one aspect of the present invention, it is possible to more accurately detect errors at the source quickly. Furthermore, since the turnaround time is relatively fast, the entire process of conversion-reconversion may not be noticeable in the design process. Once the block component is converted into the syntax of the old environment at the back end translation unit 150 (FIG. 1), the subsequent design flows based on the old environment may be used in the similar manner as if the block components were created using the old environment.

In the manner described above, in accordance with the various embodiments of the present invention, it is possible to preserve and maintain some of the prior routes used in the design of the previous generation of microprocessors. Indeed, it is often the case that many routes are manually added or edited to address issues related to timing, noise, cross-coupled capacitance, shorting, and so on. These routes may be part of the final design and may need to be preserved in the next generation microprocessor design.

For example, considering a case where there existed a problem of preserving some channel routes between block components on one side of the channel and cache on the other side of the channel. The channel routes may consist of block to block routes and blocks to cache routes. The design would require the preservation of only the block to block routes and re-route the cache to block routes. In view of the foregoing, in one aspect of the present invention, the netlist may provide information related to the connectivity as is in the existing design, and the netlist driven routing approach may be implemented to route the cache to block routes. To prepare a netlist from the beginning may not be feasible due to channel abstraction. As such, all the channel routes may be extracted from the old environment and converted to the format of the netlist driven routing of the present invention. The cache blocks may then be removed from the input and the integrated routing unit may be configured to remove the routes to the cache. The resulting routes would be the desired routes which are then converted to the existing environment format. A netlist extraction tool may then be used to provide the necessary netlist. Indeed, the removal of the cache-block routes may not possible other than manually in the old environment.

Indeed, the integrated routing unit in one aspect of the present invention may be used in the top level routing of the design of the next generation microprocessor, which may be configured to reduce the time to tapeout by permitting the sue of the existing design blocks as well as providing a compact and robust routing methodology for the new block components in the next generation microprocessor design.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A method of providing a netlist driven routing, comprising the steps of:
    retrieving one or more design parameters and one or more top level design criteria;
    translating said retrieved one or more design parameters and said top level design criteria;
    generating one or more top level re-routes based on said translated one or more design parameters and top level design criteria; and
    converting said generated one or more top level re-routes into a compatible syntax.

2. The method of claim 1 wherein said one or more design parameters include a die size, a metal orientation information of the routing layer, and a timing information.

3. The method of claim 1 wherein said one or more top level design criteria includes connectivity information corresponding to a plurality of block components of an existing design layout.

4. The method of claim 1 wherein said one or more top level design criteria includes a plurality of abstracts of block components.

5. The method of claim 1 wherein said one or more of design parameters includes one or more netlists.

6. The method of claim 1 wherein each of said one or more netlists includes a connectivity information corresponding to a respective one or more of block components.

7. The method of claim 6 wherein said connectivity information of said respective one or more of said block components include a pin name information of each of said block components and a connection information corresponding to each of said pin name information.

8. The method of claim 1 wherein generating step includes the step of optimizing each of said one or more top level re-routes.

9. The method of claim 1 further including the step of verifying said compatible syntax.

10. The method of claim 9 wherein said verifying step includes the step of comparing said converted one or more top level re-routes with a corresponding one or more netlists.

11. The method of claim 10 wherein said corresponding one or more netlists includes connection information related to an existing design layout of a microprocessor.

12. A method of providing a netlist driven routing, comprising the steps of:
    retrieving one or more design parameters and one or more top level design criteria;
    translating said retrieved one or more design parameters and said top level design criteria;
    generating one or more top level re-routes based on said translated one or more design parameters and top level design criteria;
    converting said generated one or more top level re-routes into a compatible syntax; and
    verifying said compatible syntax.

13. The method of claim 12 wherein said one or more design parameters include a die size, a metal orientation information of the routing layer, and a timing information.

14. The method of claim 12 wherein said one or more top level design criteria includes connectivity information corresponding to a plurality of block components of an existing design layout.

15. The method of claim 12 wherein said one or more top level design criteria includes a plurality of abstracts of block components.

16. The method of claim 12 wherein said one or more of design parameters includes one or more netlists.

17. The method of claim 12 wherein each of said one or more netlists includes a connectivity information corresponding to a respective one or more of block components.

18. The method of claim 17 wherein said connectivity information of said respective one or more of said block components include a pin name information of each of said block components and a connection information corresponding to each of said pin name information.

19. The method of claim 12 wherein generating step includes the step of optimizing each of said one or more top level re-routes.

20. The method of claim 12 wherein said verifying step includes the step of comparing said converted one or more top level re-routes with a corresponding one or more netlists.

21. The method of claim 20 wherein said corresponding one or more netlists includes connection information related to an existing design layout of a microprocessor.

22. An apparatus for providing a netlist driven routing, comprising
    means for retrieving one or more design parameters and one or more top level design criteria;
    means for translating said retrieved one or more design parameters and said top level design criteria;
    means for generating one or more top level re-routes based on said translated one or more design parameters and top level design criteria; and
    means for converting said generated one or more top level re-routes into a compatible syntax.

23. The apparatus of claim 22 wherein said one or more design parameters include a die size, a metal orientation information of the routing layer, and a timing information.

24. The apparatus of claim 22 wherein said one or more top level design criteria includes connectivity information corresponding to a plurality of block components of an existing design layout.

25. The apparatus of claim 22 wherein said one or more top level design criteria includes a plurality of abstracts of block components.

26. The apparatus of claim 22 wherein said one or more of design parameters includes one or more netlists.

27. The apparatus of claim 22 wherein each of said one or more netlists includes a connectivity information corresponding to a respective one or more of block components.

28. The apparatus of claim 27 wherein said connectivity information of said respective one or more of said block components include a pin name information of each of said block components and a connection information corresponding to each of said pin name information.

29. The apparatus of claim 22 wherein generating means includes means for optimizing each of said one or more top level re-routes.

30. The apparatus of claim 22 further including means for verifying said compatible syntax.

31. The apparatus of claim 30 wherein said verifying means includes means for comparing said converted one or more top level re-routes with a corresponding one or more netlists.

32. The apparatus of claim 31 wherein said corresponding one or more netlists includes connection information related to an existing design layout of a microprocessor.

* * * * *

UNITED STATES PATENT AND TRADEMARK OFFICE
CERTIFICATE OF CORRECTION

PATENT NO. : 6,654,942 B2
DATED : November 25, 2003
INVENTOR(S) : Chopra et al.

It is certified that error appears in the above-identified patent and that said Letters Patent is hereby corrected as shown below:

Title Page,
Item [75], Inventors, "Kong-Fal Woo" should be -- Kong-Fai Woo --.

Signed and Sealed this

Twenty-ninth Day of June, 2004

JON W. DUDAS
*Acting Director of the United States Patent and Trademark Office*